United States Patent [19]

McLeod et al.

[11] Patent Number: 4,746,371
[45] Date of Patent: May 24, 1988

[54] MECHANICALLY STACKED PHOTOVOLTAIC CELLS, PACKAGE ASSEMBLY, AND MODULES

[75] Inventors: Paul S. McLeod, Berkeley; John A. Cape, San Rafael; Lewis M. Fraas, El Sobrante; Larry D. Partain, Richmond, all of Calif.

[73] Assignee: Chevron Research Company, San Francisco, Calif.

[21] Appl. No.: 944,402

[22] Filed: Dec. 18, 1986

Related U.S. Application Data

[63] Continuation-in-part of Ser. No. 740,362, Jun. 3, 1985, Pat. No. 4,658,086, and a continuation-in-part of Ser. No. 921,566, Oct. 21, 1986.

[51] Int. Cl.$^4$ .................. H01L 31/06; H01L 25/08
[52] U.S. Cl. .................................. 136/249; 136/244
[58] Field of Search .................... 136/249 TJ, 244

[56] References Cited

U.S. PATENT DOCUMENTS 2,949,498  8/1960  Jackson .......................... 136/244
4,658,086  4/1987  McLeod et al. ............. 136/249 TJ

OTHER PUBLICATIONS

L. M. Fraas et al., "III-V Cell Research at Chevron," after Jun. 4, 1985.
L. D. Partain et al., "Vacuum MOCVD Fabrication of High Efficiency Cells for Multijunction Applications", Apr. 30–May 2, 1985.
L. M. Fraas et al., "Epitaxial Growth from Organometallic Sources in High Vacuum", after Jun. 19, 1985.
L. D. Partain et al., "High Efficiency Mechanical Stack Using a GaAsP Cell on a Transparent GaP Wafer," *Conference Record, 18th IEEE Photovoltaic Specialists Conf.*, Oct. 21–25, 1985, pp. 539–545.
C. Verié, *Conf. Record, 18th IEEE Photovoltaic Specialists Conf.*, (Oct. 1985), pp. 528–532 (published Apr. 1986).

*Primary Examiner*—Aaron Weisstuch
*Attorney, Agent, or Firm*—S. R. La Paglia; E. J. Keeling; E. A. Schaal

[57] ABSTRACT

The present invention is an apparatus of mechanically stacked photovoltaic cells having a bottom heat spreader and a top heat spreader, a bottom photovoltaic cell and a top photovoltaic cell, and means for forming the necessary electrical contacts. The heat spreaders are electrically insulated from each other but are thermally connected to each other. The bottom photovoltaic cell has an anode and a cathode and is thermally bonded to the bottom heat spreader and is thermally connected to the top heat spreader. The top photovoltaic cell has an anode and a cathode, is electrically insulated from the bottom photovoltaic cell, and is thermally bonded to the top heat spreader and is thermally connected to the bottom heat spreader. The means for forming the necessary electrical contacts includes a means for electrically contacting the anode of the bottom photovoltaic cell, a means for electrically contacting the cathode of the bottom photovoltaic cell, a means for electrically contacting the anode of the top photovoltaic cell, and a means for electrically contacting the cathode of the top photovoltaic cell.

18 Claims, 4 Drawing Sheets

MECHANICALLY STACKED PHOTOVOLTAIC CELLS, PACKAGE ASSEMBLY, AND MODULES

CROSS-REFERENCES TO RELATED APPLICATIONS

This application is a continuation-in-part of our application entitled "Photovoltaic Cell Package Assembly for Mechanically Stacked Photovoltaic Cells", filed on June 3, 1985 and assigned U.S. Ser. No. 740,362 which issued as U.S. Pat. No. 4,658,086. This application is also a continuation-in-part of our application entitled "GaAs on GaSb Mechanically Stacked Photovoltaic Cells, Package Assembly, and Modules", filed on Oct. 21, 1986 and assigned U.S. Ser. No. 921,566. Both of said applications are completely incorporated herein by reference for all purposes.

This invention relates to mechanically stacked photovoltaic cells.

BACKGROUND OF THE INVENTION

Researchers have investigated various multi-color photovoltaic cells to increase the overall efficiency of photovoltaic cells and to extract the maximum amount of energy from solar radiation. These multi-color photovoltaic cells can be divided into two general categories. The first category covers monolithic multi-color photovoltaic cells. A monolithic multi-color photovoltaic cell is a photovoltaic cell which has distinct regions optimized to absorb different portions of the solar radiation spectrum in a single cell. U.S. Pat. Nos. 4,404,421 and 4,451,691, incorporated herein by reference for all purposes, describe suitable monolithic cells. Although these monolithic cells are attractive from a system and manufacturing point of view, they will require considerable materials research to bring them to commercialization.

A second approach involves tandem mechanically stacked two-color photovoltaic cells. These cells comprise independent photovoltaic cells which are optimized to the different portions of the solar spectrum and are mechanically and electrically interconnected. These tandem mechanically stacked two-color photovoltaic cells offer a shorter path to commercialization primarily because one of the cells can be an already developed cell, such as Si or GaAs. U.S. application Ser. No. 645,456 filed Aug. 28, 1984, incorporated herein by reference for all purposes, describes a suitable high-band gap photovoltaic cell. Examples of high-band gap photovoltaic cells are GaAsP or AlGaAs or GaAs or Si photovoltaic cells, and the like.

These mechanically stacked cells often fall into the category of photovoltaic cells known as concentrator photovoltaic cells. A concentrator photovoltaic cell is a high efficiency photovoltaic cell which utilizes some sort of focusing optics to concentrate solar radiation from a strength of one sun to many suns, i.e., on the order of 50 to 1000 or more suns. The concentration of the solar radiation permits the photovoltaic cells to produce a greater amount of electricity per unit area than lower efficiency flat plate photovoltaic cells. This makes them especially useful for space applications where weight is of great concern and in jobs which require maximum electrical output with a minimum amount of surface area. However, a drawback to concentrator photovoltaic cells is the problem associated with interconnecting the two mechanically stacked photovoltaic cells and dissipating the heat generated by the concentration of the solar radiation. Thus, it would be highly desirable to have a mechanically stacked apparatus which can interconnect two photovoltaic cells while minimizing the effects of heat generated by the concentrated solar radiation.

In conventional mechanical stack designs, in particular, those using thin top cells, the heat generated in the top cell must be transmitted through the transparent adhesive bonding the two cells together. This can lead to undesirably high cell temperatures. To avoid this difficulty, it would be highly desirable to have a package design wherein heat spreaders incorporated therein are used both for the bottom and top cells. A further advantage would be to incorporate a wafer for the top cell that it thick enough to conduct the heat laterally to the top heat spreader. A still further advantage would be to have a design which isolates the cells so that the effects of thermal expansion are reduced or minimized.

In monolithic cell designs, the top and bottom cells must generally be current matched or the performance of the cell is limited by the cell having the lower current. Sine current matching different bandgap photovoltaic cells can sometimes be difficult, it would be desirable to have a package which permits voltage matching of the two cells. Voltage matching is beneficial because the voltages of the cells change very little with variations in solar spectrum or with the cell degradation with space radiation damage. Thus, it would also be highly desirable to have a package design which can dissipate the heat and permit the easy wiring of numerous mechanically stacked cells into a module wiring configuration for voltage matching instead of current matching.

Furthermore, it would be desirable to specify two component photovoltaic cell materials which will generate voltages which are simple multiples of each other where one of these photovoltaic cells is a well developed cell and the other can be rapidly developed to reach near its theoretical limit performance. Materials which can be rapidly developed are simple binary compounds with large optical absorption coefficients which have already been used as photodetectors.

SUMMARY OF THE INVENTION

The present invention is an apparatus comprising mechanically stacked photovoltaic cells. The apparatus includes a bottom heat spreader and a top heat spreader, a bottom photovoltaic cell and a top photovoltaic cell, and means for forming the necessary electrical contacts.

The heat spreaders are electrically insulated from each other but are thermally connected to each other. The top heat spreader has a space therein to provide for the passage of solar radiation.

The bottom photovoltaic cell has opposed major surfaces and has an anode and a cathode. The major surface of the bottom photovoltaic cell opposed to solar radiation is thermally bonded to the bottom heat spreader. Preferably, the bottom photovoltaic cell is soldered to the bottom heat spreader. In one embodiment, the bottom photovoltaic cell comprises:

(a) a conductive substrate, (b) a layer of GaSb having regions of different conductivity forming a homojunction therein and contacting the conductive substrate, and (c) a bottom cell passivating layer contacting the surface of the layer of GaSb opposite to the surface of the GaSb layer contacting the substrate. One such bottom cell passivating layer is a layer of $Al_yGa_{(1-y)}Sb$, such as $Al_{0.85}Ga_{0.15}Sb$.

In another embodiment, the bottom photovoltaic cell can comprise:

(a) a conductive substrate, and
(b) a layer of Ge having regions of different conductivity forming a homojunction therein and contacting the conductive substrate. In this embodiment, there is no requirement for a bottom cell passivating layer.

The top photovoltaic cell has opposed major surfaces, has an anode and a cathode, and is electrically insulated from the bottom photovoltaic cell. The major surface of the top photovoltaic cell incident to solar radiation is thermally bonded to the top heat spreader. Preferably, the top photovoltaic cell is soldered to the top heat spreader. The top photovoltaic cell has a bandgap energy responsive to solar radiation of shorter wavelengths than the bandgap energy of the bottom photovoltaic cell. Preferably, the top photovoltaic cell comprises:

(a) a layer of GaAs having regions of different conductivity forming a homojunction therein, and
(b) a top cell passivating layer contacting the surface of the layer of GaAs which is incident to solar radiation. One such top cell passivating layer is a layer of $Al_xGa_{(1-x)}As$, such as $Al_{0.85}Ga_{0.15}As$.

In another embodiment, the top photovoltaic cell can comprise a layer of Si having regions of different conductivity forming a homojunction therein, and a top cell passivating layer contacting the surface of the layer of Si which is incident to solar radiation.

The means for forming the necessary electrical contacts include:

a first means for electrically contacting the anode of the bottom photovoltaic cell;
a second means for electrically contacting the cathode of the bottom photovoltaic cell;
a third means for electrically contacting the anode of the top photovoltaic cell; and
a fourth means for electrically contacting the cathode of the top photovoltaic cell. Preferably, the first means and the second means are 180° apart, the third means and the fourth means are 180° apart, and the first means and the third means are 90° apart.

In one embodiment, six GaSb cells are wired in series for every two GaAs cells wired in series to form a module of predetermined output voltage under illumination. In another embodiment, three GaSb cells are wired in series for every GaAs cell to form a module of predetermined output voltage under illumination.

BRIEF DESCRIPTION OF THE DRAWINGS

In order to facilitate the understanding of this invention, reference will now be made to the appended drawings of preferred embodimens of the present invention. The drawings are exemplary only, and should not be construed as limiting the invention.

DETAILED DESCRIPTION OF THE INVENTION

In its broadest aspect, the present invention is an apparatus of mechanically stacked photovoltaic cells having a top and bottom heat spreader, two photovoltaic cells, and means for forming the necessary electrical contacts.

Figure 1:
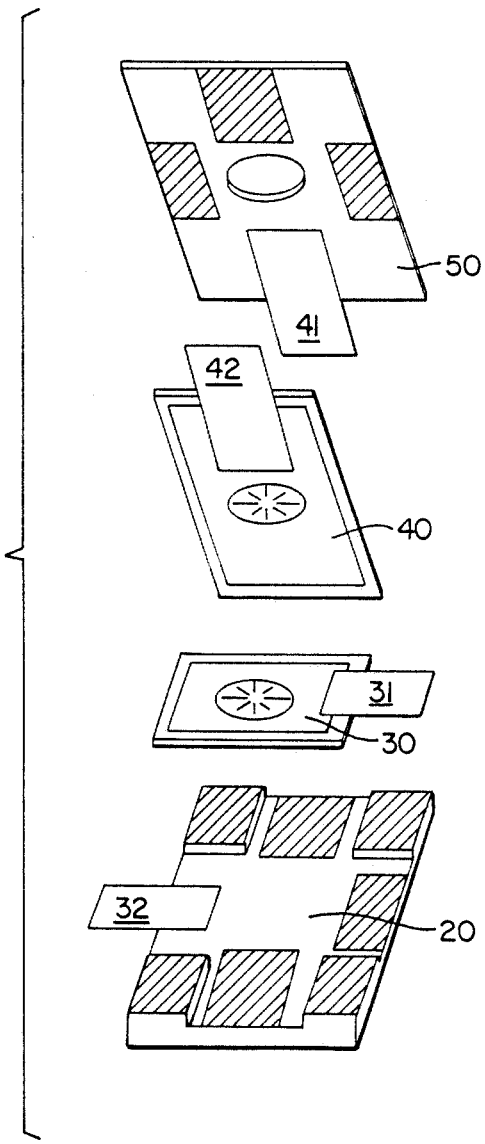
FIG. 1 illustrates an exploded view of the photovoltaic cell package assembly for mechanically stacked photovoltaic cells of our invention.
Figure 2:
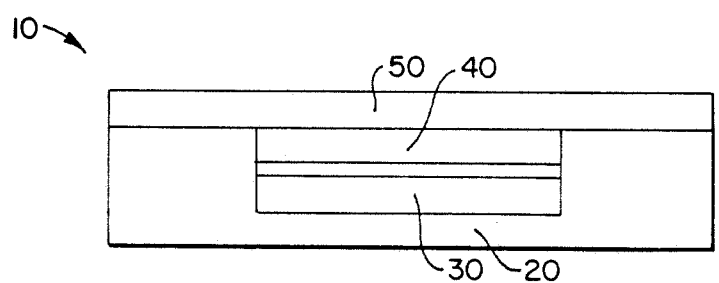
FIG. 2 illustrates a side view of the assembly.
Figure 3:
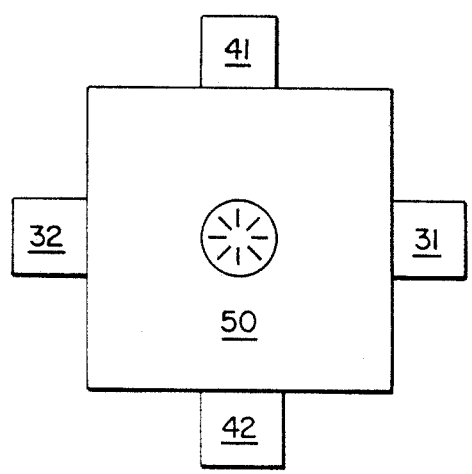
FIG. 3 illustrates a top view of the assembly.

The invention will be more clearly illustrated by referring to the Figures. FIGS. 1, 2, and 3 illustrate an exploded view, a cross sectional view, and a top view, respectively, of a mechanically stacked photovoltaic cell assembly 10. The assembly 10 has a package comprising a bottom heat spreader 20 and a top heat spreader 50. The two heat spreaders are electrically insulated from each other but are thermally connected to each other. Thermally bonded to bottom heat spreader 20 is bottom photovoltaic cell 30 having an anode and a cathode. A first electrically contacting means 31 electrically contacts the anode of bottom cell 30, and a second electrically contacting means 32 electrically contacts the cathode of bottom cell 30. Thermally bonded to top heat spreader 50 is top photovoltaic cell 40 having an anode and a cathode, and having a bandgap energy responsive to solar radiation of shorter wavelengths than the bandgap energy of bottom photovoltaic cell 30. Bottom cell 30 and top cell 40 are electrically insulated from each other. A third electrically contacting means 41 electrically contacts the anode of top cell 40 and a fourth electrically contacting means 42 electrically contacts the cathode of top cell 40.

As shown in FIGS. 1, 2, and 3, the package comprises bottom heat spreader 20 and top heat spreader 50, which form a cavity. Within the cavity are two photovoltaic cells. These two heat spreaders are electrically insulated from each other but are thermally connected to each other. Notice the hatched regions on both spreaders which represent electrically insulated regions. The top heat spreader 50 has a space therein to provide for the passage of solar radiation.

The major surface of bottom photovoltaic cell 30 opposed to solar radiation is bonded to bottom heat spreader 20 on an uninsulated region. Bottom cell 30 has opposed major surfaces and has an anode and a cathode. Preferably, bottom cell 30 is soldered to bottom heat spreader 20.

A first electrically contacting means 31 electrically contacts the anode of bottom cell 30, and a second electrically contacting means 32 electrically contacts the cathode of bottom cell 30. As shown in FIGS. 1, 2, and 3, the first electrically contacting means 31 and the second electrically contacting means 32 are 180° apart. Notice that the first electrically contacting means 31 is insulated from the bottom heat spreader 20.

The major surface of top photovoltaic cell 40 incident to solar radiation is bonded to top heat spreader 50 on an uninsulated region. Top photovoltaic cell 40 has opposed major surfaces and has an anode and a cathode. Top cell 40 and bottom cell 30 are electrically insulated from each other. The top cell 40 has a bandgap energy responsive to solar radiation of shorter wavelengths than the bandgap energy of bottom cell. Preferably, the top cell 40 is soldered to top heat spreader 50.

A third electrically contacting means 41 electrically contacts the anode of top photovoltaic cell 40 and a fourth electrically contacting means 42 electrically contacts the cathode of top photovoltaic cell 40. As shown in FIGS. 1, 2, and 3, the third electrically contacting means 41 and the fourth electrically contacting means 42 are 180° apart, and the first electrically contacting means 31 and the third electrically contacting means 41 are 90° apart. Notice that the third electrically contacting means 42 is insulated from the top heat spreader 50.

Figure 4:
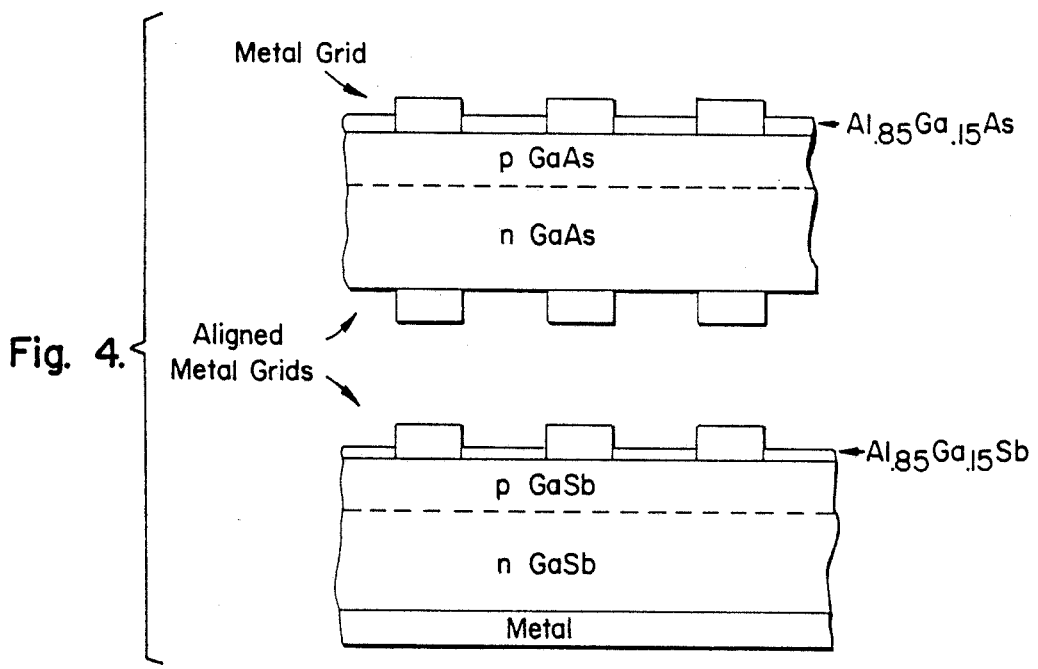
FIG. 4 illustrates a side view of the photovoltaic cells of one embodiment of the present invention.

FIG. 4 illustrates a side view of the photovoltaic cells of one embodiment of the present invention. A top GaAs cell is above a bottom GaSb cell.

The top GaAs cell comprises a layer of GaAs having regions of different conductivity forming a homojunction therein, and a top passivating layer contacting the surface of the GaAs layer which is incident to solar radiation.

As shown in FIG. 4, the layer of GaAs has regions of different conductivity forming a homojunction therein. On the side of the homojunction incident to solar radiation, the GaAs layer is doped with a p-type dopant. On the opposing side, the GaAs layer is doped with a n-type dopant. A top passivating layer of $Al_xGa_{(1-x)}As$ contacts the surface of the GaAs layer which is incident to solar radiation. In FIG. 4, x is equal to 0.85.

The formation of GaAs photovoltaic cells is well known in the art. One preferred method of forming a GaAs cell is disclosed in the paper entitle "Epitaxial Growth from Organometallic Sources in High Vacuum" presented by L. M. Fraas, P. S. McLeod, L. D. Partain, and J. A. Cape at the Electronic Materials Conference in Boulder, Colorada on June 19, 1975. Said paper is incorporated herein by reference for all purposes.

The bottom GaSb cell comprises a conductive substrate, a layer of GaSb having regions of different conductivity forming a homojunction therein and contacting the conductive substrate, and a passivating layer contacting the surface of the layer of GaSb opposite to the surface of the GaSb layer contacting the substrate.

The conductive substrate can be any material that enables the subsequently deposited semiconductor layers to grow in a crystal configuration suitable for photovoltaic cells. A suitable example is crystalline GaSb.

As shown in FIG. 4, the layer of GaSb has regions of different conductivity forming a homojunction therein. Below the homojunction is a n-type GaSb layer that contacts the conductive substrate. Above the homojunction, the GaSb layer is doped with a p-type dopant. A top passivating layer of $Al_yGa_{(1-y)}Sb$ contacts the surface of the GaSb layer which is incident to solar radiation. In FIG. 4, y is equal to 0.85.

One would expect a GaSb cell fabrication technology to closely parallel the GaAs cell fabrication technology in that AlGaSb window layers might be used to passivate the top surface of a GaSb cell. In fact, F. Capasso et al. [*Appl. Phys. Lett.*, 35, 165 (1980)] have used liquid-phase epitaxy to grow p-type AlGaSb window-passivated p-on-n GaSb photodiodes; and they have reported both the current versus voltage and spectral response characteristics for these devices.

In another embodiment of the present invention, a Ge bottom photovoltaic cell is used instead of a GaSb cell. In that embodiment, the bottom photovoltaic cell comprises a conductive substrate, and a layer of Ge having regions of different conductivity forming a homojunction therein and contacting said conductive substrate. No bottom passivating layer is required for this embodiment.

Figure 5:
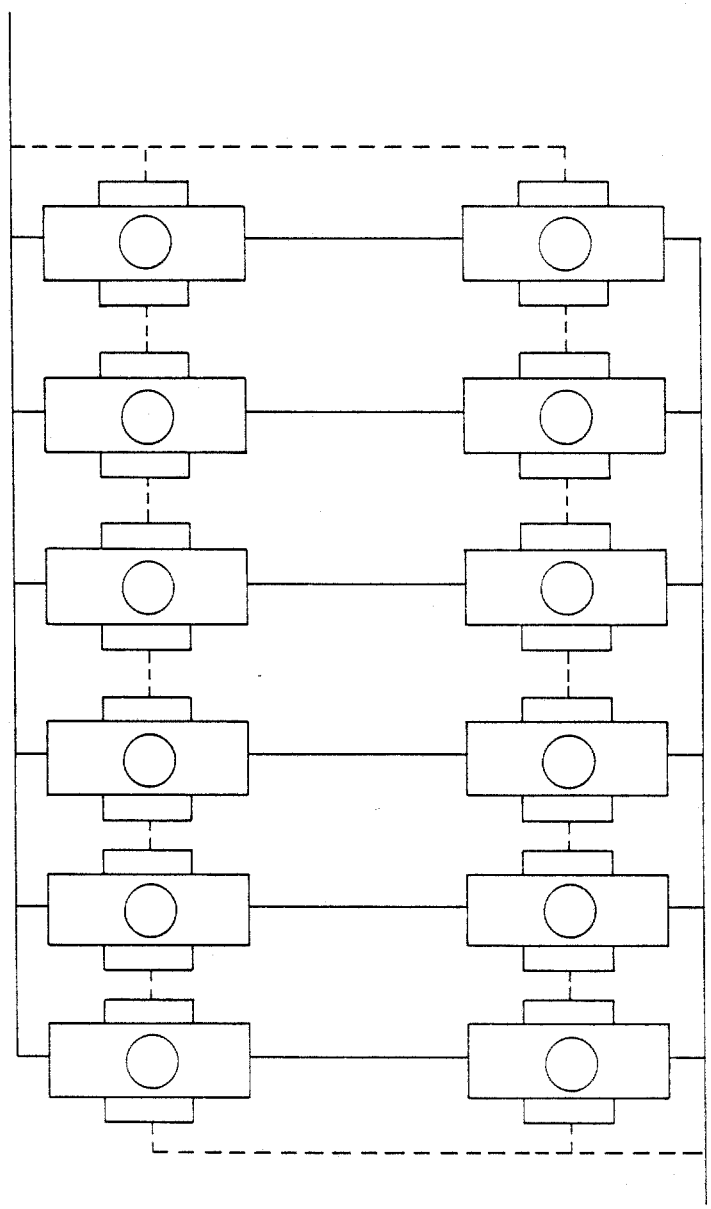
FIG. 5 illustrates a voltage matching module wiring diagram incorporating twelve mechanically stacked photovoltaic assemblies.

A benefit of the package design 10 permits module wiring configurations illustrated in FIG. 5. The package design 10 avoids the requirement for current matching of the top and bottom cells and replaces it with a voltage matching configuration. This wiring scheme benefits from the advantage that the voltage changes very little with variations in the solar spectrum or device degradation. It requires four independent leads from the cell package which is consistent with the package design described above.

More specifically, if the stacked cells were designed for series connection with currents matched at the beginning of life, the currents would be mismatched at the end of life with perforamcne loss greater than the efficiency loss of the individual cells. Voltage matching provides a longer life design since the device voltages vary only logarithmically with current changes. FIG. 5 illustrates a six by two module wiring diagram for voltage matching of top and bottom cells whose output voltages differ by a factor of 3. For the twelve element configuration illustrated, six of the bottom and two of the top cells are connected in series to provide voltage matching. Different voltage ratios for different photovoltaic cells would require other series and parallel connection schemes for voltage matching, e.g., four by three, seven by five, five by three, etc. The only limitations on the interconnection schemes are the voltages of the different cells. Of course, different modules having specific output currents and voltages can be connected in series or parallel to provide any desired overall voltage or current output for a particular application.

Figure 6:
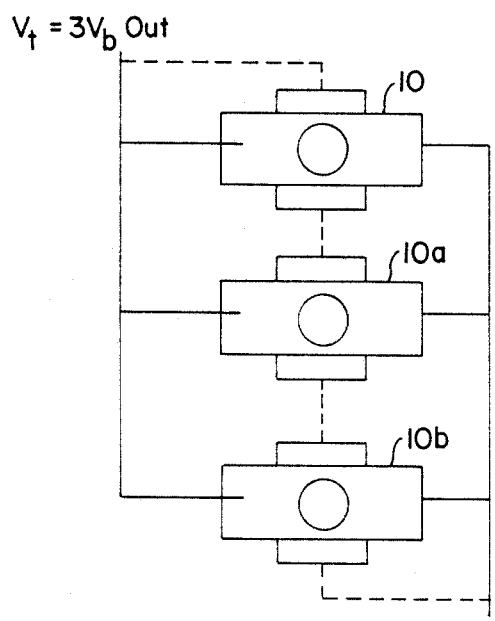
FIG. 6 illustrates a voltage matching module wiring diagram incorporating three mechanically stacked photovoltaic assemblies.

FIG. 6 illustrates a three by one module wiring diagram for voltage matching of top and bottom cells whose output voltages differ by a factor of 3. For the three element configuration illustrated, three of the bottom and one of the top cells are connected in series to provide voltage matching.

While the present invention has been described with reference to specific embodiments, this application is intended to cover those various changes and substitutions which may be made by those skilled in the art without departing from the spirit and scope of the appended claims. Modifications which would be obvious to the ordinary skilled artisan, such as selection of particular top and bottom photovoltaic cells and configuration of the spreaders are contemplated to be within the scope of the invention.

What is claimed is:

1. An apparatus comprising mechanically stacked photovoltaic cells, comprising:
   a package comprising a bottom heat spreader and a top heat spreader, wherein said heat spreaders are electrically insulated from each other but are thermally connected to each other, wherein said top heat spreader has a space therein to provide for the passage of solar radiation;
   a bottom photovoltaic cell having opposed major surfaces and having an anode and a cathode, wherein the major surface of said bottom photovoltaic cell opposed to solar radiation is thermally bonded to said bottom heat spreader;
   first electrically contacting means for electrically contacting the anode of said bottom photovoltaic cell;

second electrically contacting means for electrically contacting the cathode of said bottom photovoltaic cell;

a top photovoltaic cell having opposed major surfaces, having an anode and a cathode, and being electrically insulated from said bottom photovoltaic cell, wherein the major surface of said top photovoltaic cell incident to solar radiation is thermally bonded to said top heat spreader, and wherein said top photovoltaic cell has a bandgap energy responsive to solar radiation of shorter wavelengths than the bandgap energy to said bottom photovoltaic cell;

third electrically contacting means for electrically contacting the anode of said top photovoltaic cell; and fourth electrically contacting means for electrically contacting the cathode of said top photovoltaic cell.

2. An apparatus according to claim 1 wherein said first electrically contacting means and said second electrically contacting means are 180° apart.

3. An apparatus according to claim 2 wherein said third electrically contacting means and said fourth electrically contacting means are 180° apart.

4. An apparatus according to claim 3 wherein said first electrically contacting means and said third electrically contacting means are 90° apart.

5. An apparatus according to claim 1 wherein said bottom photovoltaic cell is soldered to said bottom heat spreader.

6. An apparatus according to claim 1 wherein said top photovoltaic cell is soldered to said top heat spreader.

7. An apparatus according to claim 1 wherein said top photovoltaic cell comprises:
(a) a layer of GaAs having regions of different conductivity forming a homojunction therein, and
(b) a top cell passivating layer contacting the surface of said layer of GaAs which is incident to solar radiation.

8. An apparatus according to claim 7 wherein said top cell passivating layer is a layer of $Al_xGa_{(1-x)}As$.

9. An apparatus according to claim 8 wherein x has a value of about 0.85.

10. An apparatus according to claim 7 wherein said bottom photovoltaic cell comprises:
(a) a conductive substrate, and
(b) a layer of GaSb having regions of different conductivity forming a homojunction therein and contacting said conductive substrate.

11. An apparatus according to claim 10 wherein said bottom photovoltaic cell further comprises a bottom cell passivating layer contacting the surface of said layer of GaSb opposite to the surface of said GaSb layer contacting said substrate.

12. An apparatus according to claim 11 wherein said bottom cell passivating layer is a layer of $Al_yGa_{(1-y)}Sb$.

13. An apparatus according to claim 12 wherein y has a value of abut 0.85.

14. An apparatus according to claim 10 further comprising wiring six bottom cells in series for every two top cell wired in series to form a module of predetermined output voltage under illumination.

15. An apparatus according to claim 10 further comprising wiring three bottom cells in series for every top cell wired in series to form a module of predetermined output voltage under illumination.

16. An apparatus according to claim 7 wherein said top photovoltaic cell comprises:
(a) a layer of Si having regions of different conductivity forming a homojunction therein, and
(b) a top cell passivating layer contacting the surface of said layer of Si which is incident to solar radiation.

17. An apparatus according to claim 7 wherein said bottom photovoltaic cell comprises:
(a) a conductive substrate, and
(b) a layer of Ge having regions of different conductivity forming a homojunction therein and contacting said conductive substrate.

18. An apparatus comprising mechanically stacked photovoltaic cells, comprising:
(a) a package comprising a bottom heat spreader and a top heat spreader, wherein said heat spreaders are electrically insulated from each other but are thermally connected to each other, wherein said top heat spreader has a space therein to provide for the passage of solar radiation;
(b) a bottom photovoltaic cell having opposed major surfaces and having an anode and a cathode, wherein the major surface of said bottom photovoltaic cell opposed to solar radiation is soldered to said bottom heat spreader, and wherein said bottom photovoltaic cell comprises:
(b1) a conductive substrate,
(b2) a layer of GaSb having regions of different conductivity forming a homojunction therein and contacting said conductive substrate, and
(b3) a bottom cell passivating layer of $Al_{0.85}Ga_{0.15}Sb$ contacting the surface of said layer of GaSb opposite to the surface of said GaSb layer contacting said substrate;
(c) first electrically contacting means for electrically contacting the anode of said bottom photovoltaic cell;
(d) second electrically contacting means for electrically contacting the cathode of said bottom photovoltaic cell, wherein said first electrically contacting means and said second electrically contacting means are 180° apart;
(e) a top photovoltaic cell having opposed major surface, having an anode and a cathode, and being electrically insulated from said bottom photovoltaic cell, wherein the major surface of said top photovoltaic cell incident to solar radiation is soldered to said top heat spreader, wherein said top photovoltaic cell has a bandgap energy responsive to solar radiation of shorter wavelengths than the bandgap energy of said bottom photovoltaic cell, and wherein said top photovoltaic cell comprises:
(e1) a layer of GaAs having regions of different conductivity forming a homojunction therein, and
(e2) a top cell passivating layer of $Al_{0.85}Ga_{0.15}As$ contacting the surface of said layer of GaAs which is incident to solar radiation;
(f) third electrically contacting means for electrically contacting the anode of said top photovoltaic cell; and
(g) fourth electrically contacting means for electrically contacting the cathode of said top photovoltaic cell, wherein said third electrically contacting means and said fourth electrically contacting means are 180° apart, and wherein said first electrically contacting means and said third electrically contacting means are 90° apart.

* * * * *